United States Patent [19]

Lin

[11] Patent Number: 4,990,988
[45] Date of Patent: Feb. 5, 1991

[54] LATERALLY STACKED SCHOTTKY DIODES FOR INFRARED SENSOR APPLICATIONS

[75] Inventor: True-Lon Lin, Cerritos, Calif.

[73] Assignee: The United States of America as represented by the Administrator of the National Aeronautics and Space Administration, Washington, D.C.

[21] Appl. No.: 363,815

[22] Filed: Jun. 9, 1989

[51] Int. Cl.⁵ .............................................. H01L 27/14
[52] U.S. Cl. ........................................ 357/30; 357/15; 357/67 S; 357/71 S
[58] Field of Search ................ 357/30 L, 30 C, 30 D, 357/30 H, 30 P, 30 Q, 30 R, 31, 32, 15, 67 S, 71 S, 76; 437/3, 904, 906

[56] References Cited

U.S. PATENT DOCUMENTS

| | | | |
|---|---|---|---|
| 4,023,258 | 5/1977 | Carlson et al. | 437/904 |
| 4,065,742 | 12/1977 | Kendall et al. | 357/76 |
| 4,319,258 | 3/1982 | Harnagel et al. | 357/15 |
| 4,731,640 | 3/1988 | Bluzer | 357/30 H |
| 4,829,173 | 5/1989 | Ditchek et al. | 357/30 C |
| 4,864,378 | 9/1989 | Tsaur | 357/30 C |
| 4,876,586 | 10/1989 | Dyck et al. | 357/30 C |
| 4,939,561 | 7/1990 | Yamaka et al. | 357/15 |

FOREIGN PATENT DOCUMENTS

| | | | |
|---|---|---|---|
| 55-95374 | 7/1980 | Japan | 357/30 C |
| 0002625 | 1/1981 | Japan | 437/904 |
| 58-21382 | 2/1983 | Japan | 357/30 C |
| 59-5680 | 1/1984 | Japan | 357/30 C |
| 59-40586 | 3/1984 | Japan | 357/30 C |
| 0229885 | 12/1984 | Japan | 437/3 |
| 61-19179 | 11/1986 | Japan | 357/30 C |
| 2101087 | 5/1987 | Japan | 437/3 |

Primary Examiner—Rolf Hille
Assistant Examiner—Minhloan Tran
Attorney, Agent, or Firm—Thomas H. Jones; John R. Manning

[57] ABSTRACT

Laterally stacked Schottky diodes (25) for infrared sensor applications are fabricated utilizing porous silicon (10) having pores (12). A Schottky metal contact (24) is formed in the pores, such as by electroplating. The sensors may be integrated with silicon circuits on the same chip with a high quantum efficiency, which is ideal for IR focal plane array applications due to uniformity and reproducibility.

6 Claims, 2 Drawing Sheets

LATERALLY STACKED SCHOTTKY DIODES FOR INFRARED SENSOR APPLICATIONS

ORIGIN OF THE INVENTION

The invention described herein was made in the performance of work under a NASA contract, and is subject to the provisions of Public Law 96-517(35U.S.C.202) in which the Contractor has elected not to retain title.

TECHNICAL FIELD

The invention relates to infrared sensors, and, more particularly, to Schottky diode infrared sensors.

BACKGROUND ART

Schottky diodes have been used as infrared (IR) sensors to form focal plane arrays which can be integrated with CCD (charge coupled device) addressing circuit and other image process circuits. The Schottky diodes have remarkable diode to diode photoresponse uniformity, wide dynamic range, and wide operating temperature range. However, the quantum efficiency of Schottky IR sensors is low due to the inherent internal emission detection mechanism, which limits operation to low f-number systems.

One possible approach to increase the quantum efficiency is using vertically stacked Schottky diodes. This apparently can only be achieved by alternative growth of epitaxial silicon and silicide layers by molecular beam epitaxy (MBE).

Use of closely packed arrays of p-n or Schottky junctions oriented perpendicular to the plane of the silicon wafer has been proposed and demonstrated for the efficient detection of visible and near-IR light. However, to achieve a high quantum efficiency for IR light, the lateral dimensions of the metal layers must be reduced so that the photo-excited electrons will be collected by the Schottky junction before losing their energy through collision with cold electrons. Also, to achieve the effect of stacked Schottky diodes, the lateral dimensions of metal layers should be less than the IR absorption length of the metal layers, which is about 200 Å. Thus, trenches must be patterned with lateral dimensions of about 200 Å and depth of several micrometers and later filled with metal to form such Schottky devices. This is difficult at best, if not impossible, with present lithographic and etching technologies.

STATEMENT OF THE INVENTION

Accordingly, it is an object of the invention to provide IR sensors comprising vertically stacked Schottky diodes.

It is another object of the invention to provide a process for forming such IR sensors.

In accordance with the invention, laterally stacked Schottky diode infrared detectors are provided utilizing porous silicon formation and electroplating. The fabricated stacked Schottky diode IR sensors have metal rods with a diameter of about 50 to 200 Å and can be several hundred μm deep.

In the process of the invention, porous silicon is formed on silicon wafers by anodization in HF electrolyte. The diameter and length of pores, as well as the spacing between pores, can be determined by the doping concentration of silicon, HF concentration, the anodizing current density, and the anodization time. The pores can be formed with diameters ranging from about 50 to 200 Å and length ranging from about 1 to more than 100 μm. The pores are then filled with a metal which forms a Schottky barrier contact with silicon by electroplating. Optionally, a silicide can be fabricated by annealing to form more uniform Schottky barriers, if desired. A thicker metal layer is subsequently evaporated to form electrical contact.

DETAILED DESCRIPTION OF THE INVENTION

Figure 1A:
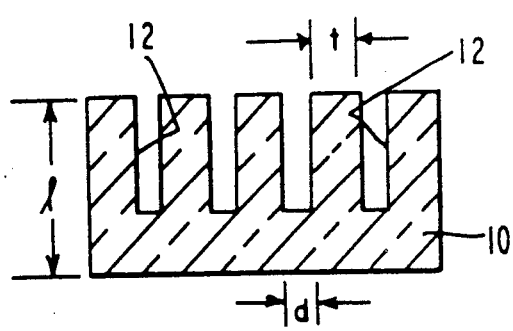
FIGS. 1a-c depict, in cross-section, the sequence in processing to form the lateral stacked Schottky diodes of the invention, with FIG. 1b' depicting an enlargement of a portion of FIG. 1b.
Figure 1B:
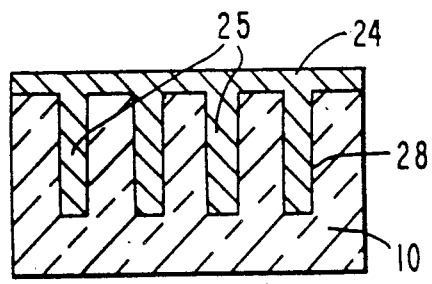
Figure 1C:
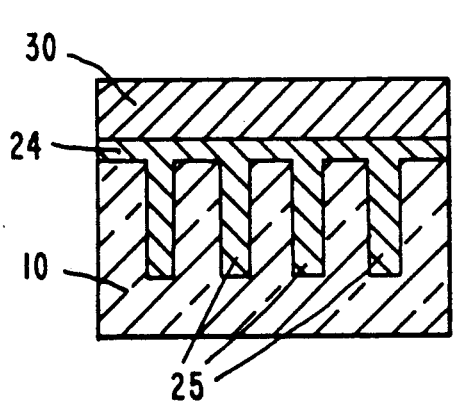
Figure 1B:
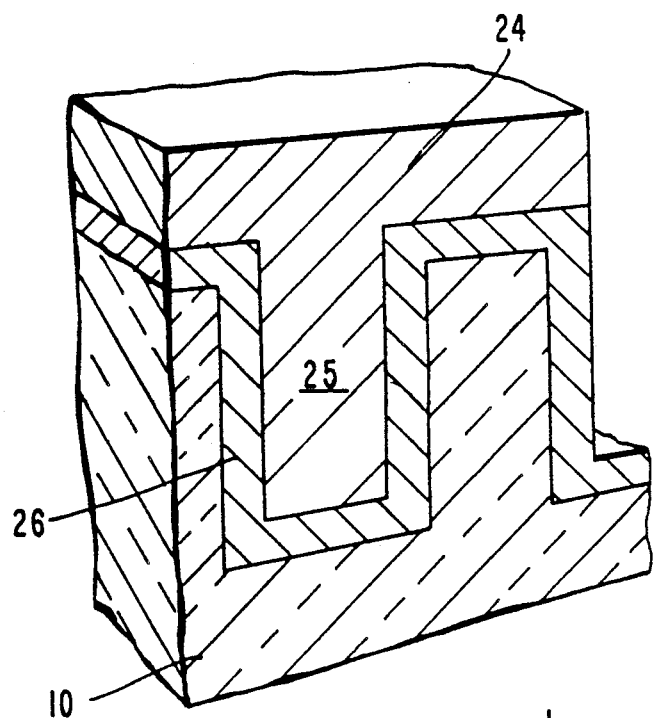

Referring now to the drawings wherein like numerals designate like elements throughout, a silicon substrate 10 is depicted in FIGS. 1a-c. In the practice of the invention, the substrate itself or an epitaxial layer of silicon may be used. The silicon may be doped, as described in greater detail below.

Pores 12 are formed in the silicon 10 by anodization in a HF electrolyte. Acetic acid can be optionally added into the electrolyte to improve the surface morphology by eliminating any build-up of hydrogen gas bubbles on the substrate surface. The addition of acetic acid may range from about 5 to 20%. The anodization process is usually performed at room temperature ($\approx 25°C$).

Figure 2:
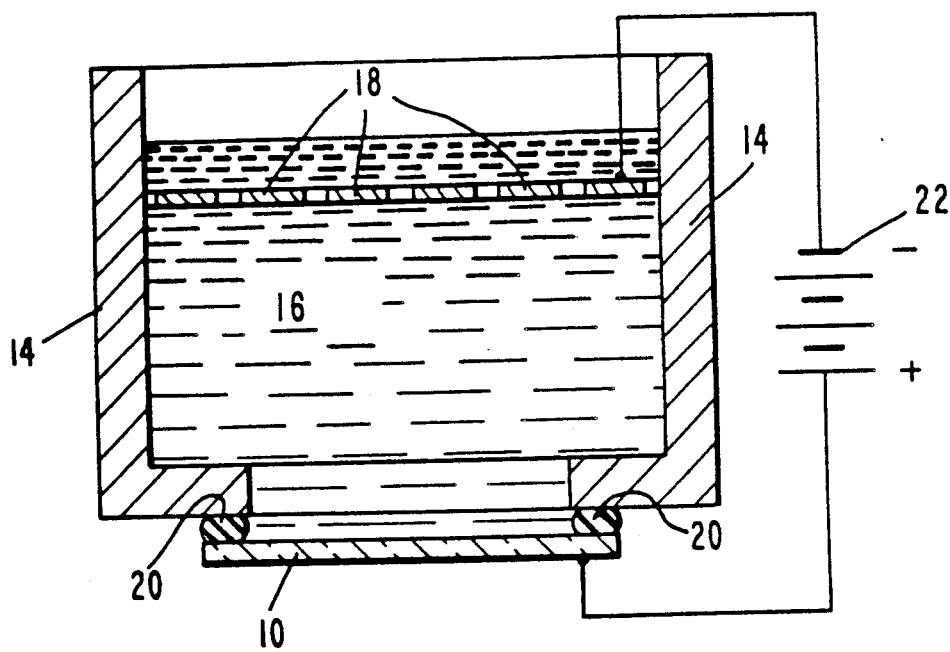
FIG. 2 depicts, in cross-section, a typical anodization system for porous silicon formation.

The typical anodization process system is shown in FIG. 2. The anodization is done in a container 14, which contains the HF electrolyte 16. A platinum mesh 18 is used as the cathode, and the silicon substrate 10 serves as the anode. The silicon substrate 10 is maintained in position by clamps (not shown) and a seal 20 prevents loss of electrolyte and insulation from the container 14. A battery 22 provides the requisite current.

Both p-type and n-type silicon substrates can be used to form the porous silicon layer. For n-type silicon, an additional process step, such as light illumination or electrical breakdown between HF electrolyte and n-type silicon, is required during the anodization process. Usually, p-type silicon is preferred because it has a lower Schottky barrier compared to n-type silicon, corresponding to a longer cut-off wavelength for IR detector applications. The doping concentration of silicon wafers for porous silicon formation ranges from about $1 \times 10^{14}$ to $1 \times 10^{20}$ cm$^{-3}$. However, for the IR detector fabrication, the doping concentration should be kept below about $1 \times 10^{18}$ cm$-3$ to avoid forming ohmic contacts instead of Schottky barrier contacts after metal deposition thereon.

Figure 3:
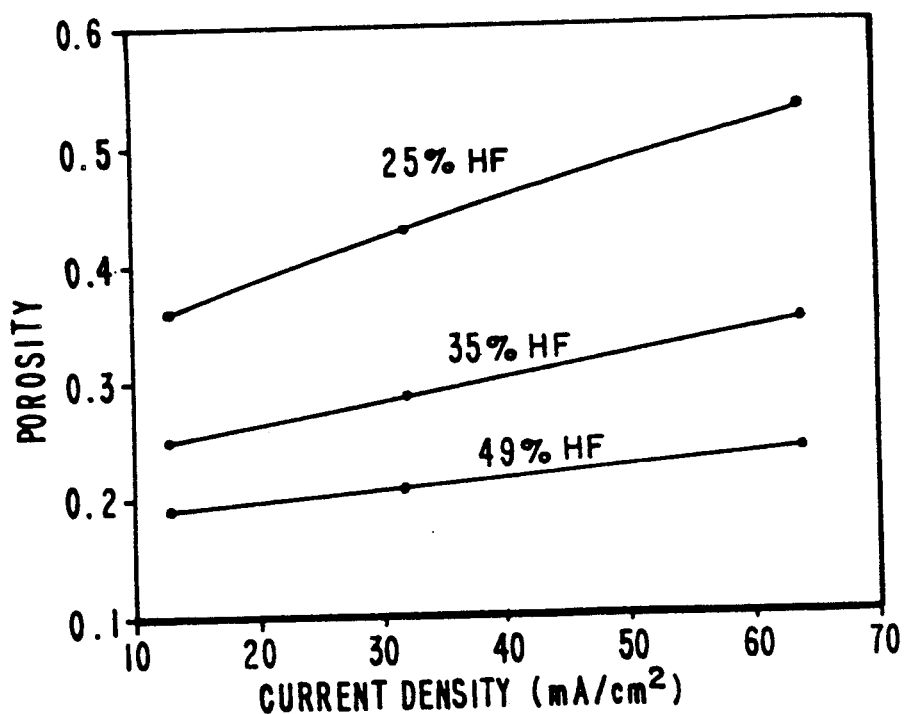
FIG. 3, on coordinates of porosity, which is defined as the volume percentage of the pores, and current density (in mA/cm$^2$), is a plot of the porosity as a function of various HF concentrations (%) and current density.

The diameter (d) of the pores, their spacing (t), and length (l) (seen in FIG. 1a) are determined by the anodization condition, including the HF concentrations, the anodizing current density, and the anodization time. The pore diameter (d) and spacing (t) usually depend on the porosity, i.e., the volume present of the pores, of the porous silicon layer. A large porosity usually corresponds to a large pore diameter as well as a large spacing. The porosity of porous silicon layers for various HF concentrations and anodizing current is shown in FIG. 3. The porosity increases with an increasing current density and a decreasing HF concentration.

The length (1) of the pores is determined by the formation rate and the anodization time. The formation rate of the pores depends on the HF concentration and the anodization current density. Typical pore formation rates for various HF concentrations and anodization current densities are shown in Table I, below. For example, pores with a length of 9 $\mu$m can be formed by anodizing Si in a 49% HF electrolyte with a current density of 64 mA/cm$^2$ for 1 min.

TABLE I

| Etching Rate (Å/sec) As A Function Of Current Density and HF Concentration. | | | |
|---|---|---|---|
| Current Density, | HF Concentration, % | | |
| mA/cm$^2$ | 25 | 35 | 49 |
| 12.8 | 250 | 300 | 360 |
| 32 | 490 | 630 | 690 |
| 64 | 850 | 1200 | 1250 |

The current density may range from about 10 to 100 mA/cm$^2$, The HF concentration may range from about 25 to 49%, and the time of etching may range from about 0.1 to 10 minutes in the practice of the invention.

Returning now to FIG. 1, the pores 12 are then filled with an appropriate metal 24 which forms a Schottky barrier with silicon 10. The resulting structure is shown in FIG. 1b. Examples of suitable metals include platinum, iridium, palladium, cobalt, and nickel. The Schottky barrier formed by these metals and their corresponding cut-off wavelength for IR detector applications are shown in Table II, below.

TABLE II

| Schottky Barrier and Wavelength Cut-off for Various Metals Contacting Silicon. | | | | | |
|---|---|---|---|---|---|
| | Pt | Ir | Pd | Co | Ni |
| Schottky Barrier, V | 0.22 | 0.35 | 0.31 | 0.48 | 0.51 |
| Cut-off, $\mu$m | 5.6 | 3.5 | 4 | 2.6 | 2.4 |

The metal is deposited by electroplating or any other deposition technique that is capable of depositing metal on the walls of the pores with about 5 to 20 nm diameter. It is preferable to fill in the pores with the metal. However, it is satisfactory to have the walls of the pores covered completely by a thin, electrically continuous metal to form the Schottky barrier. The electrodeposition parameters are those conventionally practiced in the art and do not constitute a part of this invention.

Each pore filled with metal comprises a Schottky diode 25. A plurality of such diodes formed vertically in the substrate results in lateral stacking of the diodes.

A thin silicide layer 26, with thickness ranging from about 1 to 20 nm, may optionally be formed at the metal/silicon interface 28 to improve operational characteristics of the device by providing a more uniform Schottky barrier. The structure is depicted in FIG. 1b', which is an enlargement of portion of FIG. 1b.

Advantageously, silicides are stable at higher temperatures, which may be desired for subsequent processing steps. The silicide may be formed by annealing the metal/silicon assembly of FIG. 1b. The formation temperature and time of the silicides, their corresponding Schottky barrier heights, and their cut-off wavelengths are shown in Table III, below. The annealing may be carried out at a temperature ranging from about 300° to 500° C. for a period of time ranging from about 0.5 to 2 hours. Generally, the higher temperatures are associated with the lower times, and vice versa.

TABLE III

| Schottky Barrier and Wavelength Cut-off for Various Metal Silicides Contacting Silicon. | | | | | |
|---|---|---|---|---|---|
| | PtSi | IrSi | Pd$_2$Si | CoSi$_2$ | NiSi$_2$ |
| Schottky Barrier, V | 0.22 | 0.15 | 0.37 | 0.48 | 0.42 |
| Cut-off, $\mu$m | 4.4 | 8 | 3.4 | 2.6 | 3 |

The Schottky barrier metal 24 is then provided with a thicker metal contact 30 for interconnection to other areas of the chip. The metal layer 30 can be formed by any metal deposition technique, such as evaporation, sputtering, or electroplating, to a thickness ranging from about 100 to 1,000 nm. The metal layer 30 may be the same metal used for the Schottky barrier, or may comprise metals commonly used in the fabrication process of integrated circuits, such as aluminum or gold.

INDUSTRIAL APPLICABILITY

The laterally stacked Schottky diodes described herein are expected to find use as infrared sensors.

Thus, there has been disclosed laterally stacked Schottky diodes for infrared sensor applications. It will be apparent to one of ordinary skill in the art that various changes and modifications of an obvious nature may be made, and all such changes and modifications are deemed to fall within the scope of the appended claims.

I claim:

1. An infrared sensor comprising a plurality of laterally stacked Schottky diodes, each diode comprising a Schottky barrier metal formed in an opening in a silicon substrate, each said opening having a diameter ranging from about 50 to 200 Å and a depth ranging from about 1 to more than 100 $\mu$m.

2. The sensor of claim 1 wherein said Schottky barrier metal comprises a metal selected from the group consisting of platinum, iridium, palladium, cobalt and nickel.

3. The sensor of claim 1 further including a silicide portion formed between said silicon substrate and said Schottky barrier metal.

4. The sensor of claim 3 wherein said silicide comprises a member selected from the group consisting of the silicides of platinum, iridium, palladium, cobalt and nickel.

5. The sensor of claim 1 further including a metal contact formed to said Schottky barrier metal.

6. The sensor of claim 5 wherein said metal contact comprises a metal selected from the group consisting of platinum, iridium, palladium, cobalt, nickel, aluminum, and gold.

* * * * *